United States Patent [19]

Oicles et al.

[11] 3,962,567

[45] June 8, 1976

[54] DIGITAL DISPLAY APPARATUS HAVING JITTER CORRECTION

[75] Inventors: Jeffrey A. Oicles, Glendale, Ariz.; Thomas F. Martin, Euclid, Ohio

[73] Assignee: TRW Inc., Redondo Beach, Calif.

[22] Filed: Jan. 13, 1975

[21] Appl. No.: 540,356

[52] U.S. Cl. ................ 235/92 EA; 235/92 FQ; 235/92 R
[51] Int. Cl.² ................ H03K 21/32; H03K 21/18
[58] Field of Search ....... 235/92 EA, 92 FP, 92 FQ, 235/92 PL, 92 DM

[56] References Cited
UNITED STATES PATENTS

| | | | |
|---|---|---|---|
| 3,551,809 | 12/1970 | Dufour | 235/92 EA |
| 3,602,699 | 8/1971 | Kamachi | 235/92 EA |
| 3,728,524 | 4/1973 | Gray | 235/92 EA |
| 3,818,342 | 6/1974 | Stevens | 235/92 FQ |

*Primary Examiner*—Joseph M. Thesz
*Attorney, Agent, or Firm*—Daniel T. Anderson; Edwin A. Oser; Jerry A. Dinardo

[57] ABSTRACT

A digital speedometer, frequency or event counter with digital display. The speedometer conventionally receives speed pulses representative of the speed of the vehicle. Due to the lack of synchronization between speed pulses and clock pulses the last display digit exhibits undesirable jitter. This may also be caused by backlash in the drive train or the like. This jitter is minimized by the provision of a precounter between the counter and the gate transfer to a storage register. This will permit transfer of the number generated in the counter only if the precounter is in the zero state, thus minimizing the jitter due to random occurrences of the last pulse.

2 Claims, 3 Drawing Figures

DIGITAL DISPLAY APPARATUS HAVING JITTER CORRECTION

BACKGROUND OF THE INVENTION

This invention relates generally to digital display apparatus, and particularly relates to such apparatus having means for minimizing the jitter which may otherwise occur in the last digit.

A digital speedometer has certain obvious advantages over a conventional instrument with a pointer because it presents data to the observer in a form which is easily read and which is unambigious. Thus instead of having to estimate the precise speed it can now be read in exact numbers. This applies to any digital display whether it is a speedometer, a frequency counter, an event counter or the like. In other words, it applies to any apparatus which digitally displays pulses having a variable repetition rate.

The digital speedometer may, for example, form part of a digital speed control system. Such speed control systems have become well known in the art, an example being the patent to Carol, Jr. et al., U.S. Pat. No. 3,599,154.

The jitter in a digital speedometer may be caused by the fact that the speed pulses representative of the speed of the vehicle are by necessity not synchronized with the clock pulses which control the operation of the system. Even if the speed pulses were synchronized with the clock pulses, this would only apply to one particular speed. The result is that even if the speed is constant the last digit is subject to jitter, that is the last number may vary at random between say three and four or two and three.

The jitter may also be caused by a backlash in the gear drive train which acts as the speed pulse generator. This may cause variations in the pulse rate even if the speed is constant.

Even if the actual speed of the vehicle is not actually constant, minimizing of jitter or rapid change of the last displayed digit would be useful. This is particularly true when an automobile, for example, accelerates or decelerates.

It is accordingly an object of the present invention to provide an improved digital display apparatus having means for minimizing the jitter of the last displayed digit which may otherwise occur.

SUMMARY OF THE INVENTION

A digital display apparatus in accordance with the present invention includes means for generating pulses indicative of a characteristic to be measured. These pulses which may, for example, be speed pulses in the case of a digital speedometer, are fed to a counter. After a predetermined period of time which is controlled by a time base and logic means, the number stored in the counter is transferred by transfer means or gates to a storage register. Finally, a digital display is coupled to the storage register for displaying the number transferred into the storage register.

So far the system described is entirely conventional. In order to minimize the jitter additional means are provided between the pulse generator and the counter. Preferably, this means consists of a precounter which may consist of one or more flip-flops. There may further be provided an AND gate having an input coupled to one of the outputs of the flip-flop and to the logic means for controlling the transfer means. This is so arranged that the transfer means can only transfer the number stored in the counter into the storage register when the precounter flip-flop is in the zero state where Q is false and $\bar{Q}$ is true.

In some cases it may be desirable to provide a larger precounter in the form of two slip-flops in series. This will provide an even larger control of the jitter. In other words, the last digit will only change if the variation of the input pulses is greater than a predetermined amount as will be more fully explained hereinafter.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings.

DESCRIPTION OF THE PREFERRED EMBODIMENTS

Figure 1:
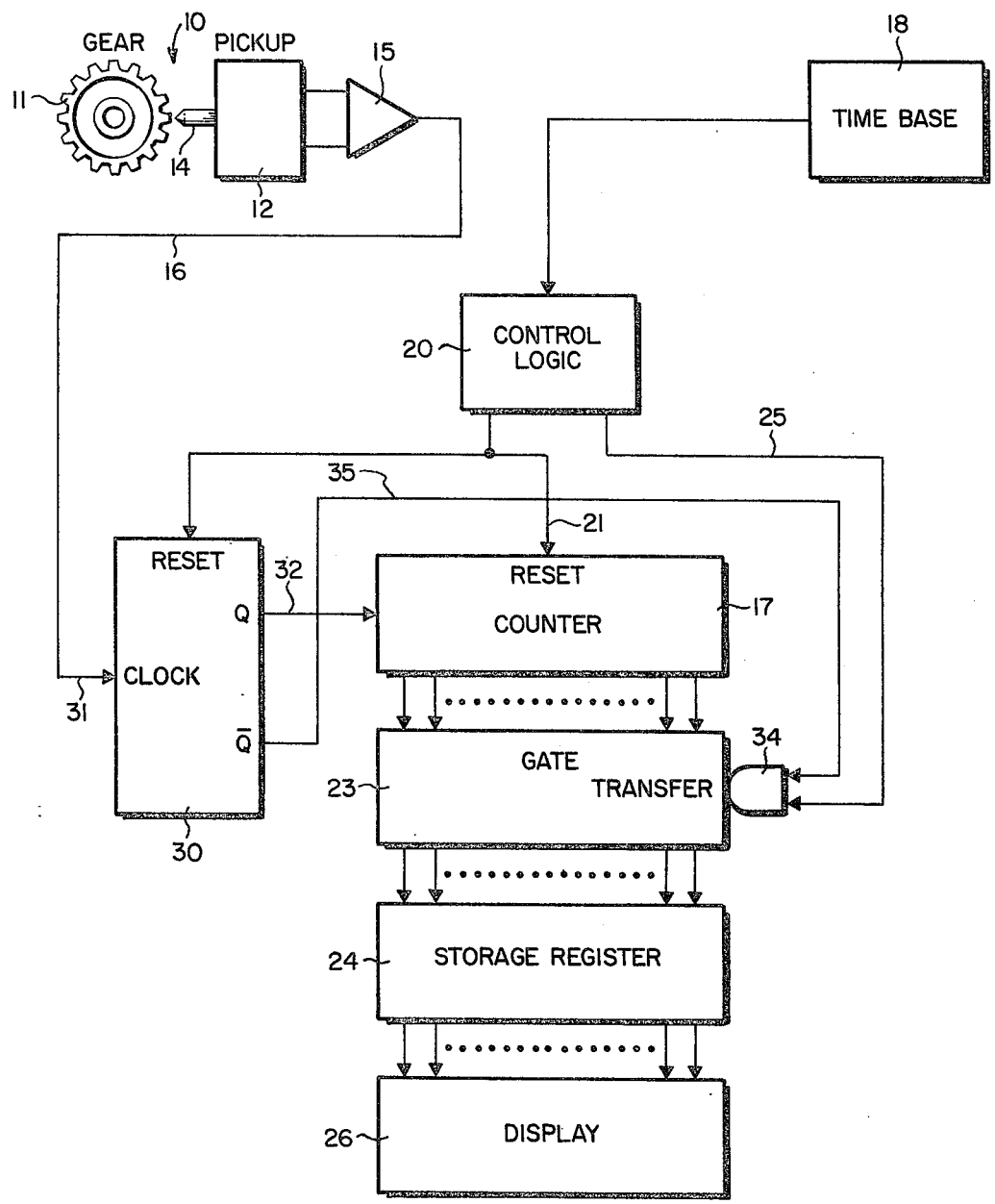
FIG. 1 is a schematic drawing in block form of a digital speedometer embodying the present invention.

Referring now to the drawings, wherein like elements are designated by the same reference characters and particularly to FIG. 1, there is illustrated in block form a digital display apparatus including means for minimizing the effects of jitter in accordance with the present invention. The digital display of FIG. 1 may form part of a digital speed control as mentioned before. However, FIG. 1 only illustrates a digital speed display.

The apparatus of FIG. 1 includes means for generating speed pulses indicative of the speed of the vehicle or in general of the number of events to be counted or a frequency to be determined. The mechanism for generating speed pulses is generally shown at 10 and may include a gear 11 connected to the drive train of the car. There may also be provided a pickup such as a magnetic pickup having a magnetic shaft 14. The details of an exemplary pickup will be more fully explained hereinafter in connection with FIG. 2. However, it will be realized that such speed pulse generating means are old in the art. The speed pulses are developed by the pickup 12 and may be amplified by an amplifier 15.

Conventionally the speed pulses are now applied through a lead 16 to a counter 17 into which they are fed in serial fashion. The counter is controlled by a time base or clock 18 through a control logic 20 connected thereto. After a period of time which may be referred to as a clock period the counter 17 is reset by applying a pulse through a lead 21 to its reset input.

By means of gates 23 the number of pulses stored in the counter 17 are transferred to a storage register 24. The transfer from counter 17 to storage register 24 by the gates 23 is controlled by a lead 25 from the control logic 20. Thus an instant before the counter 17 is reset the number stored in the counter 17 is transferred in a parallel fashion through the gates 23 to the storage register 24.

This process repeats periodically, once during each clock period. The number stored in the storage register 24 is then displayed by a suitable display device 26 which will permit a digital readout of the speed. Such displays are well known in the art and may consist of light emitting diodes or other well known light emitting elements which can be controlled by the display 26. An example of these is found in any electronic calculator.

What has been described so far is a conventional digital speed display. As explained previously, such a speed display may have a certain amount of jitter. Thus, the speed pulses are not synchronized with the clock pulses which are controlled by the time base 18. Accordingly, the last digit of the display may constantly vary by one unit up or by one unit down from the real value.

Thus, assuming that the speed is 60 mph the variation may be $60 \pm X$, where X is 1. As previously explained, this may also be caused by a backlash in the gear train represented by the gear 11.

In accordance with the present invention this jitter is minimized by the provision of a precounter flip-flop 30 having an input terminal 31 connected to the lead 16. In other words, the speed pulses are impressed on the input of the flip-flop 30. The flip-flop 30 has a true output Q which is connected by lead 32 to the counter 17. This will clock the counter.

In accordance with the present invention there is further provided an AND circuit 34 having one input connected to the lead 25, that is one input is controlled by the control logic 20 to transfer the number in the counter 17 to the storage register 24. The AND circuit 34 has a second input connected by lead 35 to the false or $\bar{Q}$ output of the flip-flop 30. As a result the AND gate 34 is only opened when the total number of speed pulses during the clock period is even so that the $\bar{Q}$ output becomes 1. This will enable the AND gate 34 to cause a transfer of the numbers stored in the counter 17 to the storage register 24 at the time the control logic 20 places a signal representation of a 1 on transfer control line 25.

It will be realized that this requires either a larger number of speed pulses or a longer clock period to provide the desired display. Thus assuming again a speed of 60 mph which normally requires say 60 speed pulses during each clock pulse period, due to the provision of the flip-flop 30, the number of speed pulses in a clock pulse period must now be 120. The jitter at 60 mph which is $60 \pm X$ is now reduced because X is 0.5 mph. An extra speed pulse during the clock period will inhibit transfer of data to the storage register and the display will not jitter.

Figure 2:
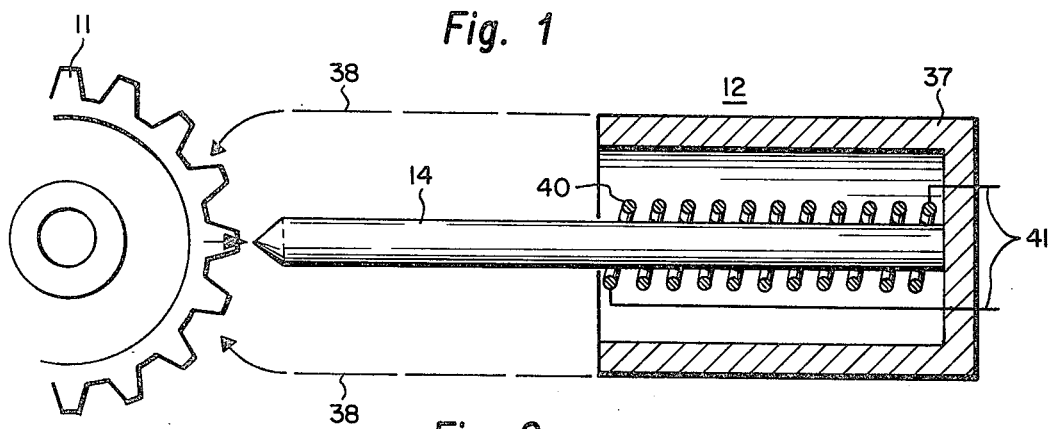
FIG. 2 is a sectional view on enlarged scale of a magnetic pickup device for generating speed pulses representative of the speed of a vehicle.

Referring now to FIG. 2, there is shown by way of example a pickup suitable for the system of FIG. 1. The magnetic shaft 14 cooperates with the teeth of the gear 11. The shaft 14 is surrounded by a cup-shaped housing 37 of magnetic material. The lines of force are shown at 38 and issue from the cup-shaped housing 37 through the gear 11 back into the shaft 14 which closes the magnetic circuit. The magnetic circuit is periodically interrupted every time a tooth moves away from the shaft 13. This magnetic discontinuity is picked up by the coil 40 surrounding shaft 14 to derive an output pulse between the output leads 41 which may be connected to the amplifier 15. The pulse generator of FIG. 2 is only shown as an example, such generators being known in the art.

In some cases it may not be sufficient for minimizing the effects of jitter to have only a single flip-flop 30. This may, for example, be due to random variations in the times between successive pulses. This in turn may be due to drive train backlash or the like. In such a case the embodiment of the invention illustrated in FIG. 3 may be used. Here a second flip-flop 45 has been provided ahead of the flip-flop 30 to form a two bit precounter. The speed pulses are impressed by lead 16 on the input of the flip-flop 45. Its Q output is impressed by lead 46 on the flip-flop 30. Additionally, the $\bar{Q}$ output of flip-flop 45 is impressed by lead 47 on the AND circuit 34 which now has three inputs.

Figure 3:
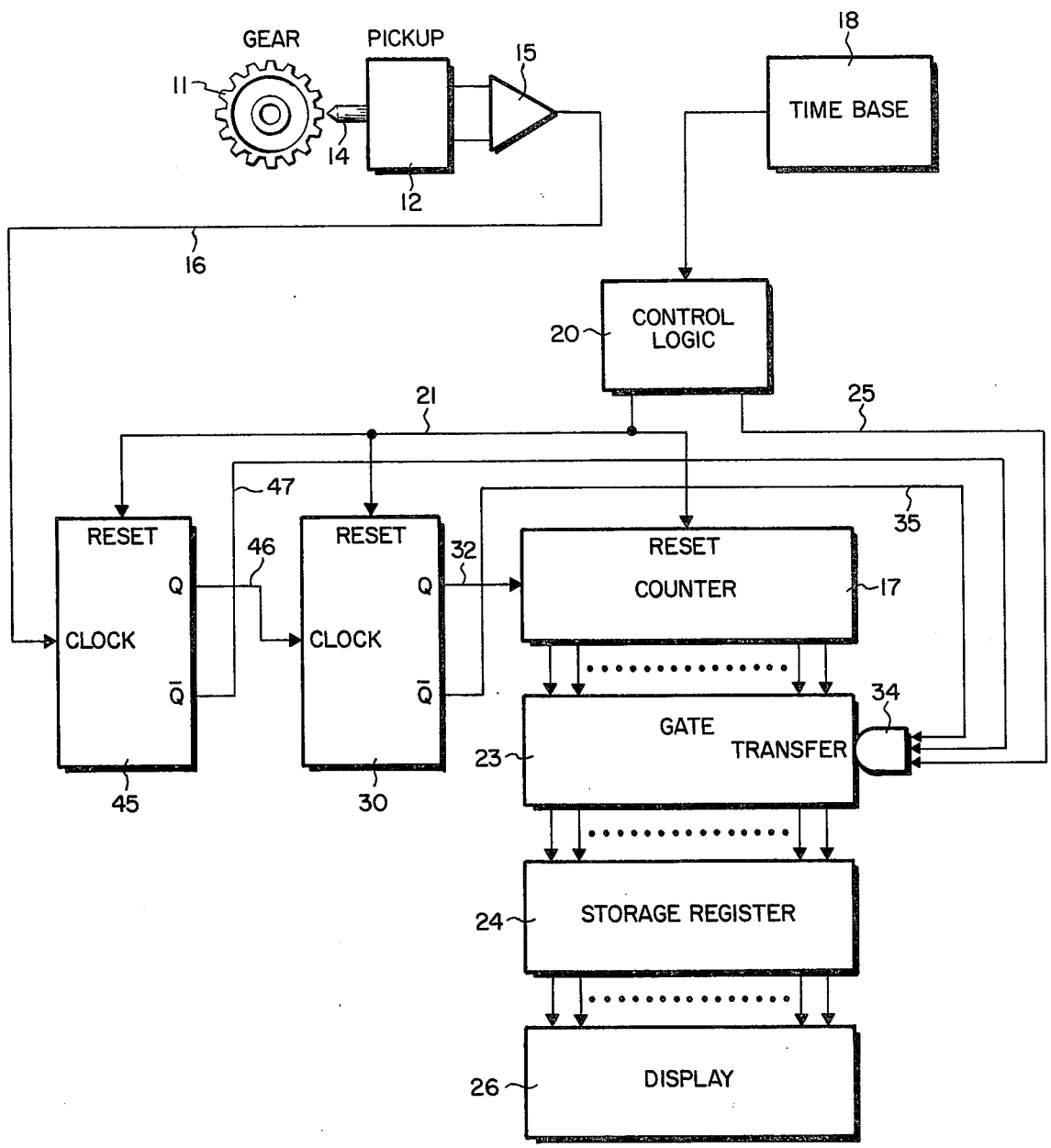
FIG. 3 is a schematic drawing similar to that of FIG. 1 and illustrating another embodiment of the present invention permitting even greater control of the jitter of the display device.

The circuit of FIG. 3 operates generally in the same manner as does that of FIG. 1. However, the number of speed pulses obtained from lead 16 is now divided by 4. Therefore, in the example previously discussed of a speed of 60 mph, the number of speed pulses per clock pulse period must be 240. As explained before this can either be effected by increasing the number of the teeth of the gear 11 or by increasing the clock pulse period. In any case the gates 23 can only be energized to transfer the number in counter 17 to the storage register 24 when both $\bar{Q}$ outputs of the two flip-flops 45 and 30 are 1 and if the transfer pulse is present. In this case the jitter is minimized because if the jitter is now $60 \pm X$, X can be as great as 0.75 mph without affecting the display 26. In other words, if the number of speed pulses during the clock period varies anywhere between 237 and 243, the speedometer will consistently display 60 mph and the storage register will be refreshed only when the number of speed pulses equals 240.

There has thus been disclosed a digital display apparatus such as a digital speedometer having means for minimizing the effects of jitter on the last display digit. This is accomplished by the provision of a precounter ahead of the counter of the digital display. The precounter may consist of one or more flip-flops in series. This will in effect divide the number of incoming pulses by a factor of $2^N$, where N is the number of flip-flops in the precounter so that in conjunction with appropriate gating jitter is minimized even if the speed varies slightly or if the nonsynchronism between the pulses to be displayed and the time base becomes large.

What is claimed is:
1. A digital display apparatus having means for minimizing the effects of jitter, said apparatus comprising:
   a. means for generating pulses indicative of a quantity to be measured;
   b. a pulse counter coupled to said pulse generating means;
   c. a storage register;
   d. transfer means coupled between said pulse counter and said storage register for periodically transferring the number stored in said counter;
   e. a time base;
   f. logic means controlled by said time base and coupled to said counter and to said transfer means for periodically transferring the number in said counter by said transfer means to said storage register and for periodically resetting said counter after the occurrence of a predetermined period of time;
   g. a first flip flop precounter coupled between said pulse generating means and said counter;

h. an AND gate coupled between said flip flop, said logic means and said transfer means, whereby said transfer means is only rendered operative by said AND gate when said flip flop is in a predetermined one of two possible states; and i. digital display means coupled to said storage register for displaying a number representative of the number of pulses occurring in said predetermined period.

2. Apparatus as defined in claim 1 wherein an additional flip flop is serially connected between said pulse generating means and said first flip flop, said AND gate being coupled to both of said flip flops for controlling said transfer means, whereby said transfer means is rendered operative only if said flip flops are in a predetermined one of four possible states.

* * * * *